(12) United States Patent
He et al.

(10) Patent No.: US 12,074,202 B2
(45) Date of Patent: Aug. 27, 2024

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Qingyuan He, Suzhou (CN); Ronghui Hao, Suzhou (CN); Fu Chen, Suzhou (CN); Jinhan Zhang, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 452 days.

(21) Appl. No.: 17/616,202

(22) PCT Filed: Nov. 9, 2021

(86) PCT No.: PCT/CN2021/129612
§ 371 (c)(1),
(2) Date: Dec. 3, 2021

(87) PCT Pub. No.: WO2023/082056
PCT Pub. Date: May 19, 2023

(65) Prior Publication Data
US 2023/0352540 A1 Nov. 2, 2023

(51) Int. Cl.
*H01L 29/20* (2006.01)
*H01L 29/06* (2006.01)
(Continued)

(52) U.S. Cl.
CPC ...... *H01L 29/2003* (2013.01); *H01L 29/1066* (2013.01); *H01L 29/452* (2013.01);
(Continued)

(58) Field of Classification Search
CPC ............. H01L 29/2003; H01L 29/1066; H01L 29/66462; H01L 29/7786; H01L 29/0619; H01L 29/0657
See application file for complete search history.

(56) References Cited

U.S. PATENT DOCUMENTS 9,577,048 B1 2/2017 Yang et al.
2009/0206371 A1* 8/2009 Oka ..................... H01L 29/4236
257/E29.091
(Continued)

FOREIGN PATENT DOCUMENTS

| | | |
|---|---|---|
| CN | 107958931 A | 4/2018 |
| CN | 112768505 A | 5/2021 |
| WO | 2011027490 A1 | 3/2011 |

OTHER PUBLICATIONS

International Search Report and Written Opinion of the corresponding PCT application No. PCT/CN2021/129612 mailed on Jun. 29, 2022.
(Continued)

*Primary Examiner* — Mohsen Ahmadi
(74) *Attorney, Agent, or Firm* — Li & Cai Intellectual Property (USA) Office

(57) ABSTRACT

A nitride-based semiconductor device includes a first and a second nitride-based semiconductor layers, a source electrode, a gate electrode, and a drain structure. The drain structure includes a first doped nitride-based semiconductor layer, an ohmic contact electrode, and a conductive layer. The first doped nitride-based semiconductor layer is in contact with the second nitride-based semiconductor layer to form a first contact interface. The ohmic contact electrode is in contact with the second nitride-based semiconductor layer to form a second contact interface. The conductive layer includes metal and in contact with the second nitride-based semiconductor layer to form a metal-semiconductor junction
(Continued)

therebetween. The conductive layer is connected to the first doped nitride-based semiconductor layer and the ohmic contact electrode, and the ohmic contact interface is farther away from the gate electrode than the first contact interface and the second contact interface.

18 Claims, 11 Drawing Sheets

(51) Int. Cl.
| | |
|---|---|
| *H01L 29/10* | (2006.01) |
| *H01L 29/417* | (2006.01) |
| *H01L 29/45* | (2006.01) |
| *H01L 29/47* | (2006.01) |
| *H01L 29/66* | (2006.01) |
| *H01L 29/778* | (2006.01) |
| *H01L 29/872* | (2006.01) |

(52) U.S. Cl.
CPC ...... *H01L 29/475* (2013.01); *H01L 29/66462* (2013.01); *H01L 29/7786* (2013.01); *H01L 29/872* (2013.01)

(56) References Cited

U.S. PATENT DOCUMENTS

| | | | |
|---|---|---|---|
| 2015/0021616 A1* | 1/2015 | Lee | H01L 29/7787 |
| | | | 257/76 |
| 2020/0105917 A1 | 4/2020 | Okita et al. | |
| 2020/0328296 A1* | 10/2020 | Hwang | H01L 29/66462 |
| 2020/0357907 A1* | 11/2020 | Udrea | H01L 21/8252 |
| 2021/0050209 A1* | 2/2021 | Liu | H01L 21/0254 |

OTHER PUBLICATIONS

Mike Cooke, "Embedded Schottky diode for unidirection GaN HFET", Semiconductor Today, Jan. 5, 2014.

* cited by examiner

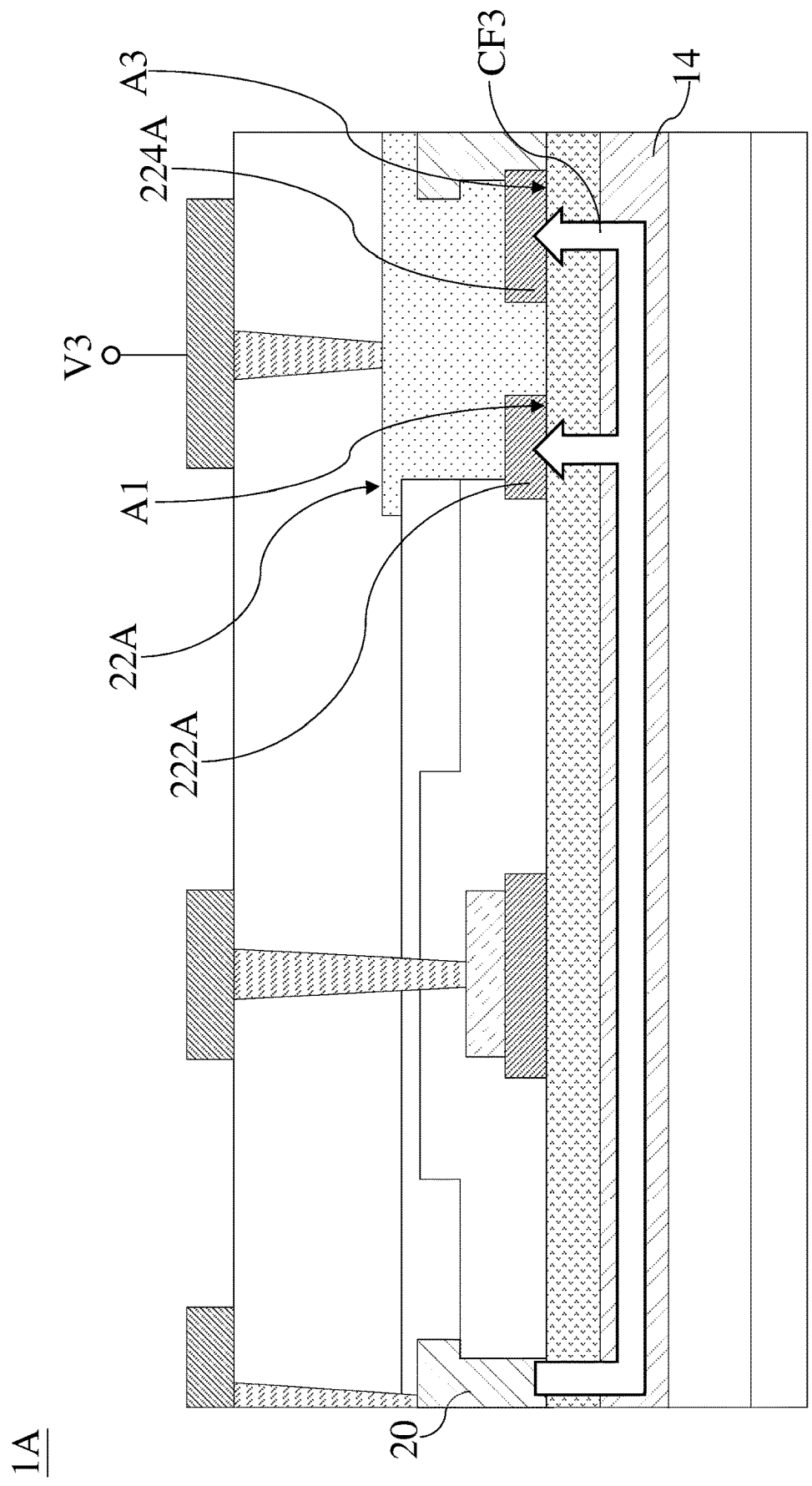

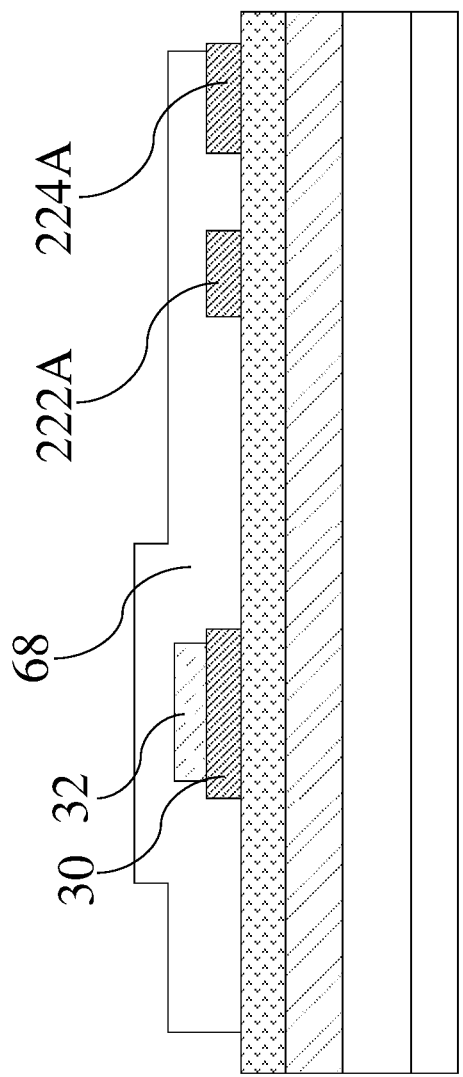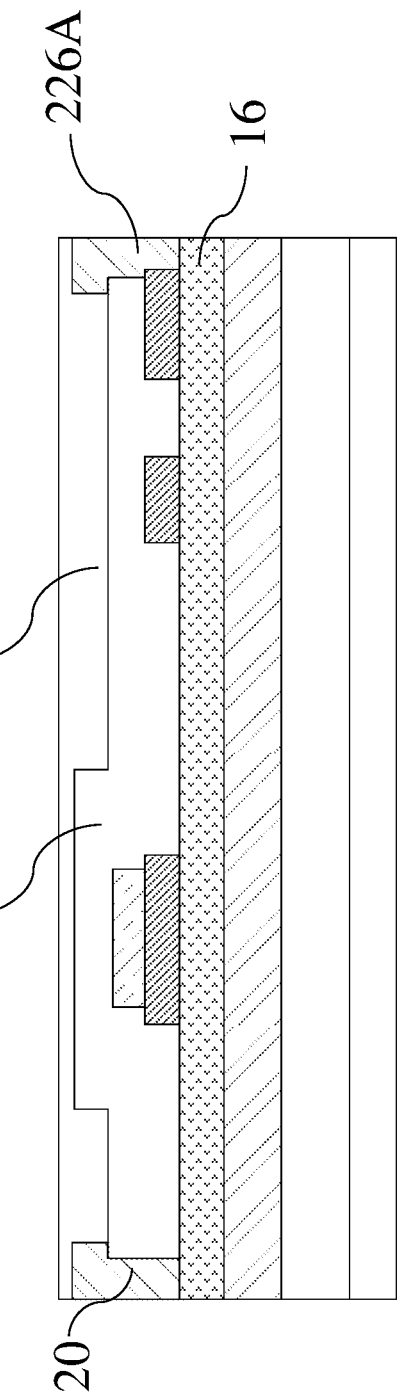

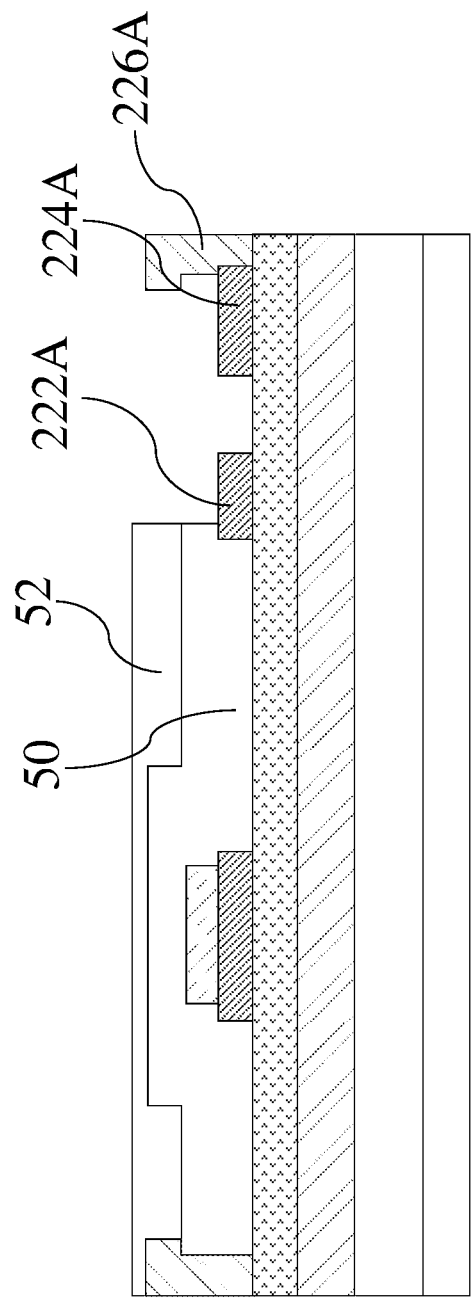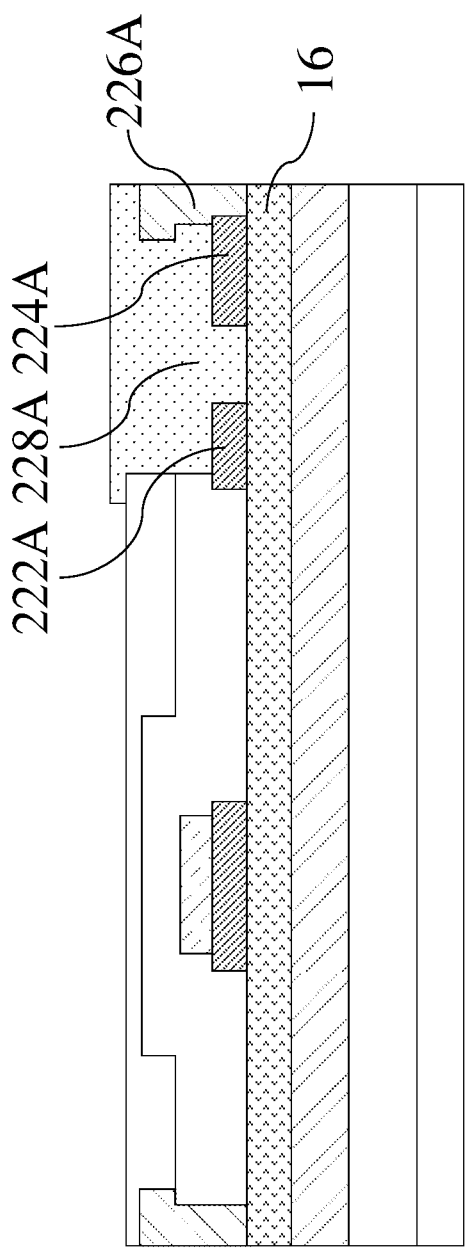

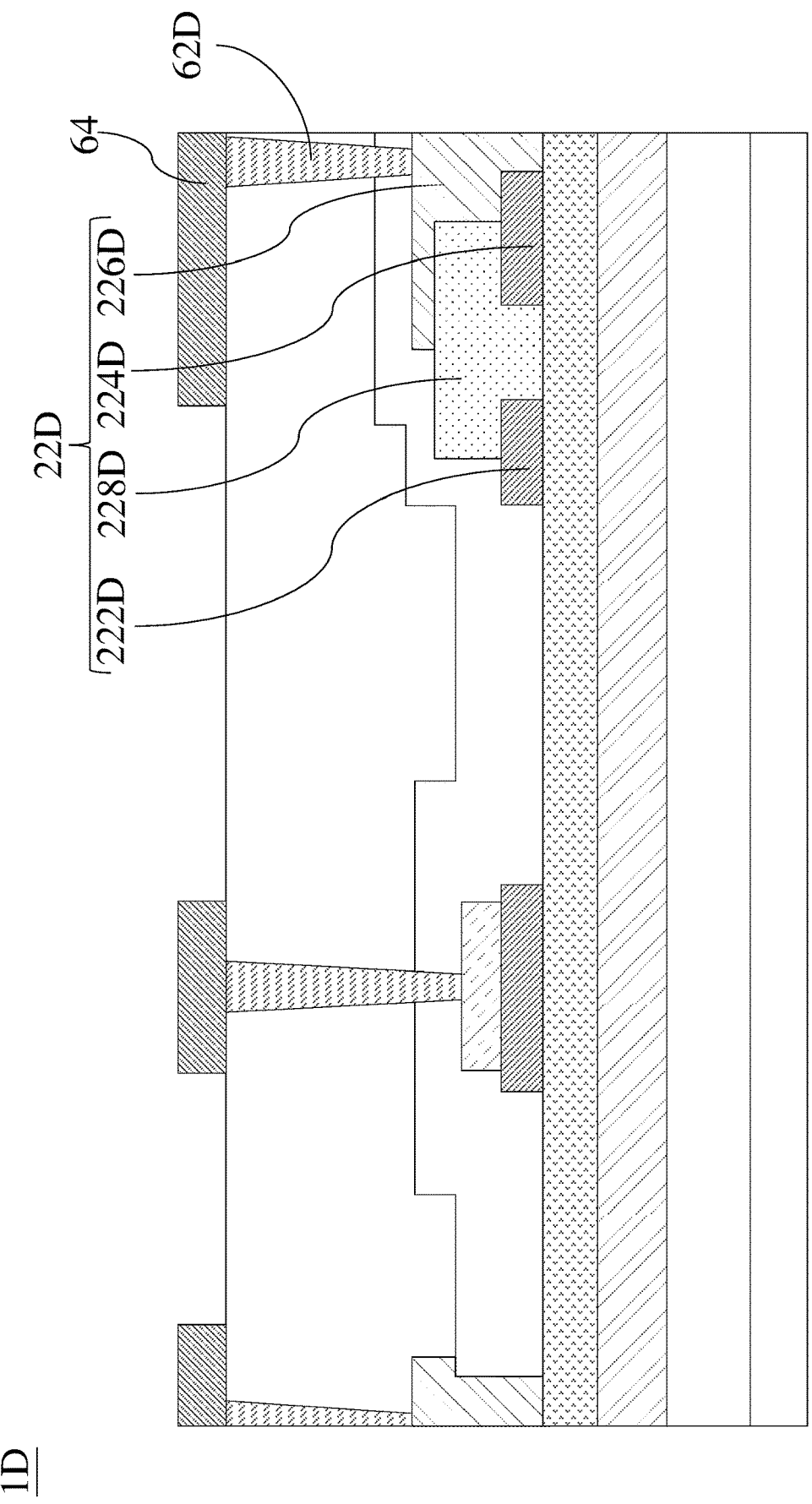

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device having an electrode structure with a junction barrier Schottky-ohmic (JBS-ohmic) structure.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

Due to the excellent characteristics of gallium nitride (GaN), GaN-based devices can be applied to different circuits, for example, a DC-DC conversion circuit, a DC-AC conversion circuit and an AC-AC conversion circuit. In particular, with respect to the AC-AC conversion circuit, it needs to use a bidirectional switch circuit to facilitate its circuit function. Accordingly, how to put HEMTs into a circuit to constitute a bidirectional switch circuit becomes one of the research directions.

SUMMARY OF THE DISCLOSURE

In accordance with one aspect of the present disclosure, a nitride-based semiconductor device is provided. The nitride-based semiconductor device includes a first nitride-based semiconductor layer, a second nitride-based semiconductor layer, a source electrode, a gate electrode, and a drain structure. The second nitride-based semiconductor layer is disposed on the first nitride-based semiconductor layer and has a bandgap greater than a bandgap of the first nitride-based semiconductor layer. The source electrode and the gate electrode are disposed over the second nitride-based semiconductor layer. The drain structure is disposed over the second nitride-based semiconductor layer. The drain structure includes a first doped nitride-based semiconductor layer, an ohmic contact electrode, and a conductive layer. The first doped nitride-based semiconductor layer is in contact with the second nitride-based semiconductor layer to form a first contact interface. The ohmic contact electrode is in contact with the second nitride-based semiconductor layer to form a second contact interface. The conductive layer includes metal and in contact with the second nitride-based semiconductor layer to form a metal-semiconductor junction therebetween. The conductive layer is connected to the first doped nitride-based semiconductor layer and the ohmic contact electrode, and the second contact interface is farther away from the gate electrode than the first contact interface and the metal-semiconductor junction.

In accordance with one aspect of the present disclosure, a method for manufacturing a nitride-based semiconductor device is provided. The method includes steps as follows. A first nitride-based semiconductor layer is formed on a substrate. A second nitride-based semiconductor layer is formed on the first nitride-based semiconductor layer. A first doped nitride-based semiconductor layer is formed to be in contact with the second nitride-based semiconductor layer. An ohmic contact electrode is formed to be in contact with the second nitride-based semiconductor layer and with the first doped nitride-based semiconductor layer. A conductive layer is formed to be in contact with the second nitride-based semiconductor layer, with the first doped nitride-based semiconductor layer, and with the ohmic contact electrode.

In accordance with one aspect of the present disclosure, a nitride-based semiconductor device is provided. The nitride-based semiconductor device includes a first nitride-based semiconductor layer, a second nitride-based semiconductor layer, a source electrode, a gate electrode, a metal electrode, and a conductive layer. The second nitride-based semiconductor layer is disposed on the first nitride-based semiconductor layer and has a bandgap greater than a bandgap of the first nitride-based semiconductor layer. The source electrode and the gate electrode are disposed over the second nitride-based semiconductor layer. The metal electrode is in contact with the second nitride-based semiconductor layer and forms an ohmic contact area with the second nitride-based semiconductor layer. The conductive layer is in contact with the second nitride-based semiconductor layer and forms a Schottky diode with the second nitride-based semiconductor layer. The first doped nitride-based semiconductor layer is in contact with the second nitride-based semiconductor layer and forms a first PN diode with the second nitride-based semiconductor layer. The Schottky diode and the first PN diode are present between the gate electrode and the ohmic contact area.

By the above configuration, in the embodiments of the present disclosure, an interface between the drain structure and the second nitride-based semiconductor layer (e.g., the barrier layer) is a complex interface integrated with a PN diode, a Schottky diode, and an ohmic contact, in which the ohmic contact is the farthest among three of them from the gate electrode. Thus, depletion regions of the PN diode and the Schottky diode can be located between the gate electrode and the ohmic contact, which is advantageous to improve the reverse withstand voltage of the device. Moreover, when the drain structure is applied to a forward bias, electrons can flow at least one of the PN diode, the Schottky diode, and the ohmic contact according to the magnitude of the forward bias. Such the configuration can increase forward current and reduce $R_{on}$ of the semiconductor device. When the drain structure is applied to a reverse bias, the doped nitride-based semiconductor layer of the drain structure can reduce the electric field near the Schottky diode, thereby reducing leakage current and power consumption and increasing efficiency of the device.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIGS. 2A to 2C are schematic diagrams of a carrier flow in a semiconductor device during an operation according to some embodiments of the present disclosure;

FIG. 3A, FIG. 3B, FIG. 3C, FIG. 3D, FIG. 3E, and FIG. 3F show different stages of a method for manufacturing a nitride-based semiconductor device according to some embodiments of the present disclosure;

FIG. 6 is a vertical view of a semiconductor device according to some embodiments of the present disclosure.

DETAILED DESCRIPTION

Figure 1A:
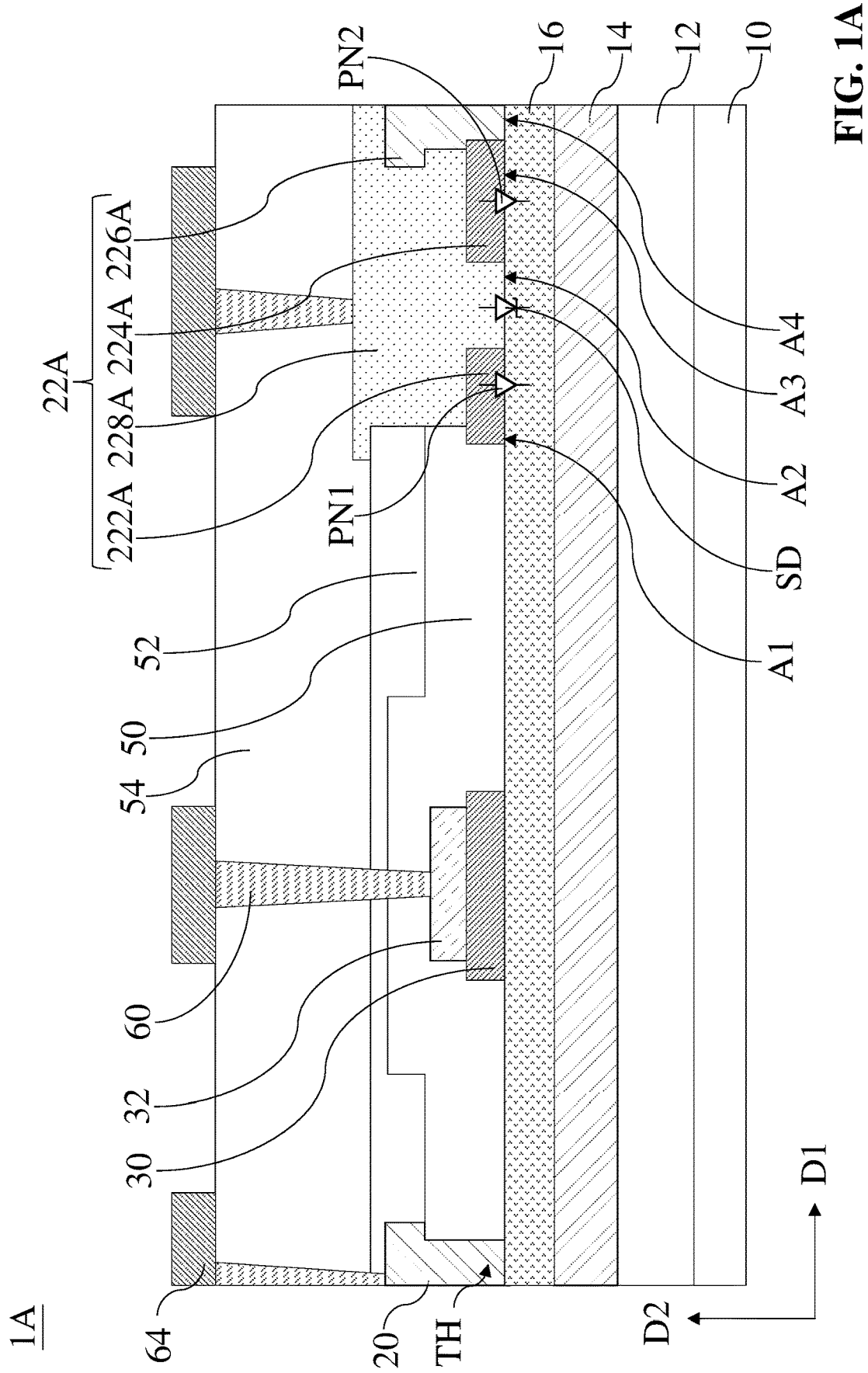
FIG. 1A is a vertical view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a vertical view of a semiconductor device 1A according to some embodiments of the present disclosure. Directions D1 and D2 are labeled in the FIG. 1A, in which the directions D1 and D2 are different than each other. In some embodiments, the directions D1 and D2 are perpendicular to each other. For example, the direction D1 is the horizontal direction of FIG. 1A and the direction D2 is the vertical direction of FIG. 1B.

The semiconductor device 1A includes a substrate 10, a buffer layer 12, nitride-based semiconductor layers 14, 16, an electrode 20, an electrode structure 22A, a doped nitride-based semiconductor layer 30, a gate electrode 32, dielectric layers 50, 52, a passivation layer 54, contact vias 60 and 62, and a patterned conductive layer 64.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14. The buffer layer 12 can be configured to reduce lattice and thermal mismatches between the substrate and the nitride-based semiconductor layer 14, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14 can be disposed on/over/above the substrate 10 and the buffer layer 12. The nitride-based semiconductor layer 14 can be in contact with the buffer layer 12. The nitride-based semiconductor layer 16 can be disposed on/over/above the nitride-based semiconductor layer 14. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The exemplary materials of the nitride-based semiconductor layer 16 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 14 and 16 are selected such that the nitride-based semiconductor layer 16 has a bandgap (i.e., forbidden band width) greater/higher than a bandgap of the nitride-based semiconductor layer 14, which causes electron affinities thereof different from each other and forms a heterojunction therebetween. For example, when the nitride-based semiconductor layer 14 is an undoped GaN layer having a bandgap of approximately 3.4 eV, the nitride-based semiconductor layer 16 can be selected as an AlGaN layer having bandgap of approximately 4.0 eV. As such, the nitride-based semiconductor layers 14 and 16 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

Generally speaking, with respect to a design of a HEMT device, a distance between a gate electrode and a source electrode ($L_{gs}$) is designed to be less than that of a gate electrode and a drain electrode ($L_{gd}$) for reducing on-resistance ($R_{on}$). Such a design would weaken the reverse withstand voltage of the device. For example, when a HEMT is applied to a bidirectional switch, what needs to be ensured is the electrical characteristics under different operation modes (e.g., a forward bias operation mode and a reverse bias operation mode), so as to avoid excessive power consumption.

To cure such the issues, as considered of a HEMT that is provided with a gate electrode and a p-doped nitride-based semiconductor layer stacked on the gate electrode, the p-doped nitride-based semiconductor layer can form a PN diode with a barrier layer. However, the required turn-on voltage of the PN diode is large, such that the power consumption thereof is unable to be effectively reduced. Alternatively, as considered of a HEMT that is provided with composite electrode material to form only an ohmic contact and a Schottky contact, during a reverse bias mode, leakage current may be raised at the Schottky contact, which leads to excessive power consumption.

Hence, the aforesaid HEMTs cannot have good electrical properties under both the reverse bias operation mode and the forward bias operation mode. At least to avoid the afore-mentioned issues, the present disclosure is to provide a novel structure for HEMT devices.

Referring back to FIG. 1A, the electrode 20 and the electrode structure 22A can be disposed on/over/above the nitride-based semiconductor layer 16. The electrode 20 and the electrode structure 22A can be in contact with the nitride-based semiconductor layer 16. In some embodiments, the electrode 20 can serve as a source electrode. In some embodiments, the electrode structure 22A can serve as a drain electrode structure. In some embodiments, the electrode 20 can serve as a drain electrode. In some embodiments, the electrode structure 22A can serve as a source electrode structure. The role of the electrodes 20 and 22A depends on the device design.

Specifically, in embodiments of the present disclosure, the electrode structure 22A is formed to be a composite electrode structure. The electrode structure 22A includes doped nitride-based semiconductor layers 222A, 224A, an ohmic contact electrode 226A, and a conductive layer 228A.

The doped nitride-based semiconductor layers 222A and 224A are disposed on/over/above the nitride-based semiconductor layer 16. The doped nitride-based semiconductor layers 222A and 224A are in contact with the nitride-based semiconductor layer 16 (i.e., barrier layer), to form contact interfaces A1 and A3, respectively. The doped nitride-based semiconductor layers 222A and 224A may have the different widths than each other. For example, a width of the doped nitride-based semiconductor layer 224A can be greater than that of the doped nitride-based semiconductor layer 222A. In some embodiments, the doped nitride-based semiconductor layers 222A and 224A can have substantially the same width.

The doped nitride-based semiconductor layers 222A and 224A can be p-type doped III-V semiconductor layers. The exemplary materials of the doped nitride-based semiconductor layers 222A and 224A can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. Therefore, each of the doped nitride-based semiconductor layers 222A and 224A can form a PN diode PN1/PN2 with the nitride-based semiconductor layer 16.

The ohmic contact electrode 226A is disposed on/over/above the nitride-based semiconductor layer 16. The ohmic contact electrode 226A is in contact with the nitride-based semiconductor layer 16 (i.e., barrier layer) to form a contact interface A4. The doped nitride-based semiconductor layer 224A can abut against the ohmic contact electrode 226A to form a vertical interface therebetween. The contact interface A4 can be an ohmic contact interface. The area of the contact interface A4 can serve as an ohmic contact area.

In some embodiments, the electrode 20 and the ohmic contact electrode 226A can include, for example but are not limited to, metals, alloys, doped semiconductor materials (such as doped crystalline silicon), compounds such as silicides and nitrides, other conductor materials, or combinations thereof. The exemplary materials of the electrode 20 and the ohmic contact electrode 226A can include, metal or metal compound, for example but are not limited to, Ti, AlSi, TiN, or combinations thereof. That is to say, the electrode 20 and the ohmic contact electrode 226A can be metal electrodes.

In some embodiments, the electrode 20 and the ohmic contact electrode 226A may be a single layer, or plural layers of the same or different composition. The electrode 20 and the ohmic contact electrode 226A form ohmic contacts with the nitride-based semiconductor layer 16 (e.g., barrier layer). Furthermore, the ohmic contacts can be achieved by applying Ti, Al, or other suitable materials to the electrode 20 and the ohmic contact electrode 226A.

In some embodiments, each of the electrode 20 and the ohmic contact electrode 226A is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The conductive layer 228A can be disposed on/over/above the nitride-based semiconductor layer 16. The conductive layer 228A can be in contact with the nitride-based semiconductor layer 16. The conductive layer 228A can be physically connected to the doped nitride-based semiconductor layers 222A, 224A, and the ohmic contact electrode 226A. The conductive layer 228A directly covers top surfaces of the doped nitride-based semiconductor layers 222A and 224A, and the ohmic contact electrode 226A. The conductive layer 228A entirely fills a region between the doped nitride-based semiconductor layers 222A and 224A to make contact with the nitride-based semiconductor layer 16. The conductive layer 228A extends upward to a position higher than the doped nitride-based semiconductor layers 222A, 224A, and the ohmic contact electrode 226A. The doped nitride-based semiconductor layer 224A abuts against and is located between the conductive layer 228A and the ohmic contact electrode 226A.

The exemplary materials of the conductive layer 228A can include metal, for example but not limited to, titanium nitride (TiN), tantalum nitride (TaN), tungsten nitride (WN), tungsten (W), nickel (Ni), or combinations thereof. The conductive layer 306A may be formed from metal alloy which may include, for example but are not limited to, titanium/gold (Ti/Au), titanium/aluminum/nickel/gold (Ti/Al/Ni/Au), or combinations thereof.

Therefore, a metal-semiconductor junction A2 can be formed between the conductive layer 228A and the nitride-based semiconductor layer 16 (i.e., barrier layer). The conductive layer 228A and the nitride-based semiconductor layer 16 can collectively form a Schottky diode SD across the metal-semiconductor junction A2.

The relationship among the contact interface A1, the metal-semiconductor junction A2, the contact interface A3, and the contact interface A4 is stated as follows. The contact interface A1 is present between the metal-semiconductor junction A2 and the gate electrode 32. The metal-semiconductor junction A2 is located between the contact interfaces A1 and A3. The metal-semiconductor junction A2 and the contact interface A3 are present between the gate electrode 32 and the contact interface A4. The contact interface A3 is present between the metal-semiconductor junction A2 and the contact interface A4.

The metal-semiconductor junction A2 abuts against the contact interfaces A1 and A3. The contact interface A3 abuts against the metal-semiconductor junction A2 and the contact interface A4.

Briefly, along the direction D1 from the gate electrode 32 toward the ohmic contact electrode 226A, the contact interface A1, the metal-semiconductor junction A2, the contact interface A3, and the contact interface A4 are arranged in sequence. Accordingly, the contact interface A4 (i.e., the ohmic contact interface) is farther away from the gate electrode 32 than the contact interfaces A1 and A3, and the metal-semiconductor junction A2.

In view of the arrangement of the components, the PN diode PN1 is present between the Schottky diode SD and the gate electrode 32. The Schottky diode SD is located between the PN diodes PN1 and PN2. The PN diode PN2 is present between the gate electrode 32 and the contact interface A4. The PN diode PN2 is present between the Schottky diode SD and the contact interface A4. Therefore, the PN diodes PN1 and PN2, and the Schottky diode SD are located between the gate electrode 32 and the ohmic contact electrode 226A.

Figure 1B:
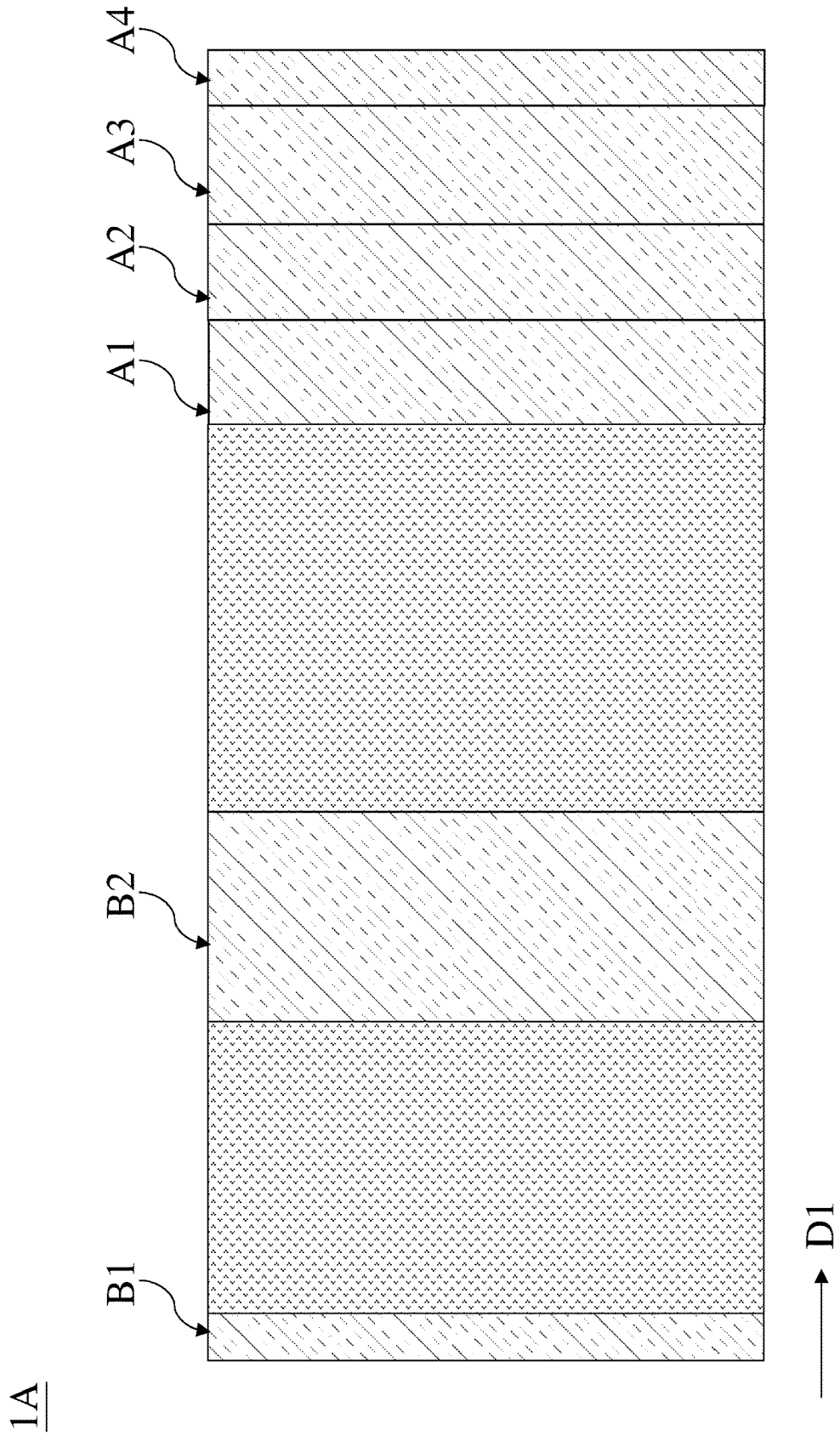
FIG. 1B depicts contact interfaces with a barrier layer in a structure of a semiconductor device of FIG. 1A according to some embodiments.

More specifically, FIG. 1B depicts contact interfaces with a barrier layer in a structure of a semiconductor device 1A of FIG. 1A according to some embodiments. The direction D1 is also illustrated in FIG. 1B. The electrode 20 forms an interface B1 with the nitride-based semiconductor layer 16; and the doped nitride-based semiconductor layer 30 forms an interface B2 with the nitride-based semiconductor layer 16.

Along the direction D1, the arrangement is that the interface B1, the interface B2, the contact interface A1, the metal-semiconductor junction A2, the contact interface A3, and the contact interface A4 are arranged in sequence. The contact interface A4 is the furthest away from the gate electrode 32 among the contact interface A1, the metal-semiconductor junction A2, the contact interface A3, and the contact interface A4.

The interface B1, the interface B2, the contact interface A1, the metal-semiconductor junction A2, the contact interface A3, and the contact interface A4 can extend along a vertical direction of FIG. 1B. It is related to the distribution of the layers in the structure.

Referring back to FIG. 1A, the electrode structure 22A including the aforesaid interfaces can act as a junction barrier Schottky-ohmic (JBS-ohmic) structure. The detailed working mechanism of the electrode structure 22A will be described later.

The doped nitride-based semiconductor layer 30 can be disposed on/over/above the nitride-based semiconductor layer 16. The doped nitride-based semiconductor layer 30 can be in contact with the nitride-based semiconductor layer 16. The gate electrode 32 can be disposed on/over/above the doped nitride-based semiconductor layer 30. The gate electrode 32 can be in contact with the doped nitride-based semiconductor layer 30. The doped nitride-based semiconductor layer 30 and the gate electrode 32 can serve as a gate structure.

The doped nitride-based semiconductor layer 30 and the gate electrode 30 can be located between the electrode 20 and the electrode structure 22A. The electrode 20, the electrode structure 22A, and the gate electrode 32 can at least constitute a GaN-based HEMT device with the 2DEG region.

A width of the doped nitride-based semiconductor layer 30 is greater than that of the gate electrode 32. In some embodiments, a width of the doped nitride-based semiconductor layer 30 is substantially the same as a width of the gate electrode 32. The profiles of the doped nitride-based semiconductor layer 30 and the gate electrode 32 are the same, for example, both of them are rectangular profiles. In other embodiments, the profiles of the doped nitride-based semiconductor layer 30 and the gate electrode 32 can be different from each other, for example, the profile of the doped nitride-based semiconductor layer 30 can be a trapezoid profile, while the profile of the gate electrode 32 can be a rectangular profile.

In the exemplary illustration of FIG. 1A, the semiconductor device 1A is an enhancement mode device, which is in a normally-off state when the gate electrode 32 is at approximately zero bias. Specifically, the doped nitride-based semiconductor layers 30 may create p-n junctions with the nitride-based semiconductor layer 16 to deplete the 2DEG region, such that zones of the 2DEG region corresponding to positions below the corresponding the doped nitride-based semiconductor layer 30 have different characteristics (e.g., different electron concentrations) than the remaining portion of the 2DEG region and thus is blocked.

Due to such mechanism, the semiconductor device 1A has a normally-off characteristic. In other words, when no voltage is applied to the gate electrode 32 or a voltage applied to the gate electrode 32 is less than a threshold voltage (i.e., a minimum voltage required to form an inversion layer below the gate electrode 32), the zone of the 2DEG region below the doped nitride-based semiconductor layers 32 are kept blocked, and thus no current flows therethrough.

The exemplary material of the doped nitride-based semiconductor layer 30 can be identical with or similar with that of the doped nitride-based semiconductor layers 222A and 224A. In some embodiments, the nitride-based semiconductor layer 14 includes undoped GaN and the nitride-based semiconductor layer 16 includes AlGaN, and the doped nitride-based semiconductor layer 30 is a p-type GaN layer which can bend the underlying band structure upwards and to deplete the corresponding zone of the 2DEG region, so as to place the semiconductor device 1A into an off-state condition.

The exemplary materials of the gate electrode 32 may include metals or metal compounds. The gate electrode 32 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Cu, Al, metal alloys or compounds thereof, or other metallic compounds.

As afore-mentioned, when a HEMT device is in a switch-off mode (i.e., reverse bias operation mode), a power consumption issue is concerned. By the JBS-ohmic structure, the power consumption of the semiconductor 1A can be reduced.

Depletion regions resulting from the PN diodes PN1 and PN2, and the Schottky diode SD are located between the contact interface A4 and the gate electrode 32, so this configuration can improve the reverse withstand voltage of the device. More specifically, the doped nitride-based semiconductor layers 222A and 224A in combination with the Schottky diode SD can deplete electrons in the 2DEG region. Since the Schottky diode SD is located between the doped nitride-based semiconductor layers 222A and 224A, the doped nitride-based semiconductor layers 222A and 224A can counteract at least a part of the electric field near the Schottky diode SD. At the reverse bias working mode, the leakage current near the Schottky diode SD can be reduced, and thus the power consumption can be reduced. Therefore, the semiconductor device 1A can have good working performance at the reverse operation mode.

The reason for forming the Schottky diode SD and for placing the ohmic contact electrode 226A at the furthest position away from the gate electrode 32 in the JBS-ohmic structure is to reduce on-resistance of the semiconductor device 1A, thereby enhancing forward current at the forward bias operation mode.

Figure 2A:
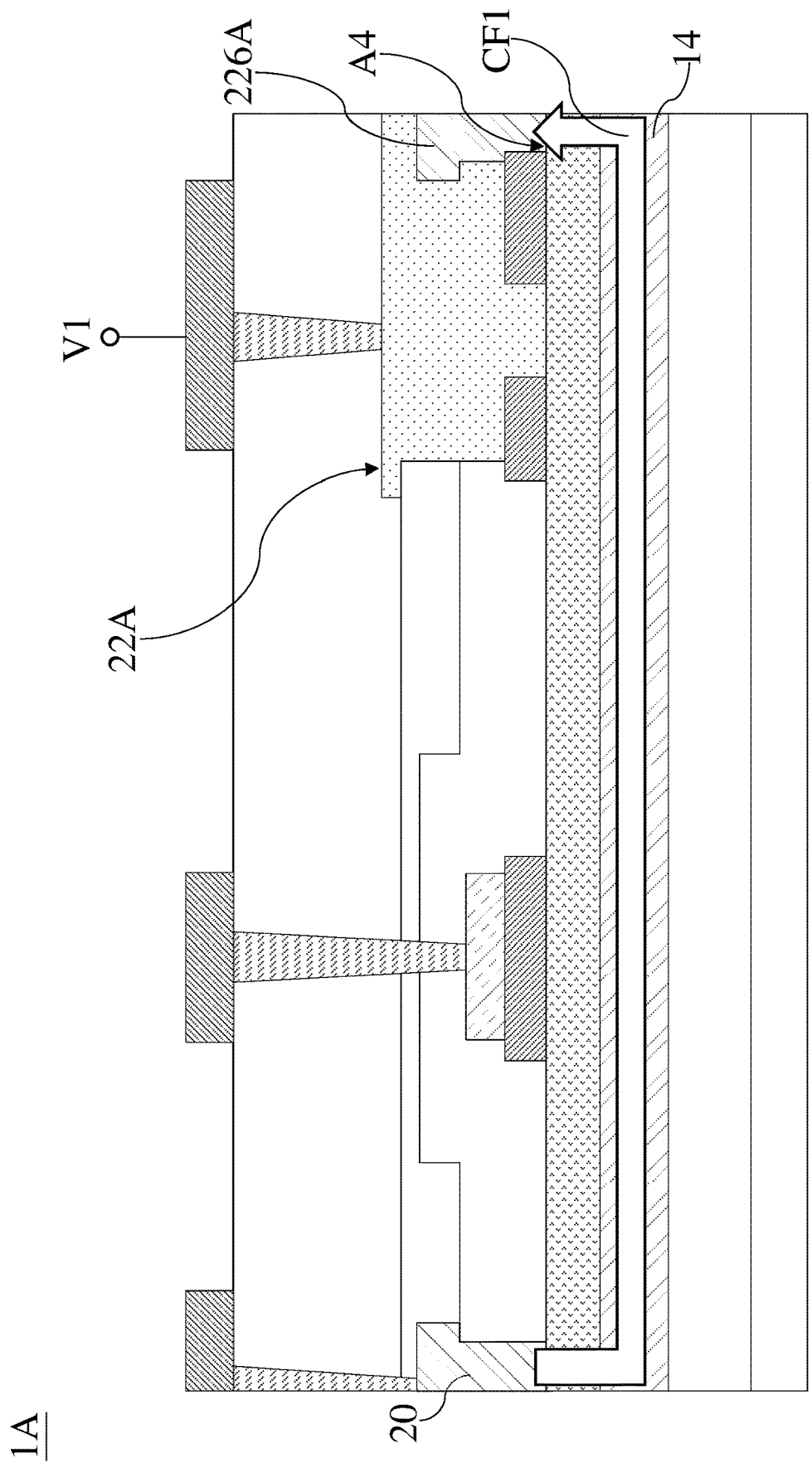
Figure 2B:
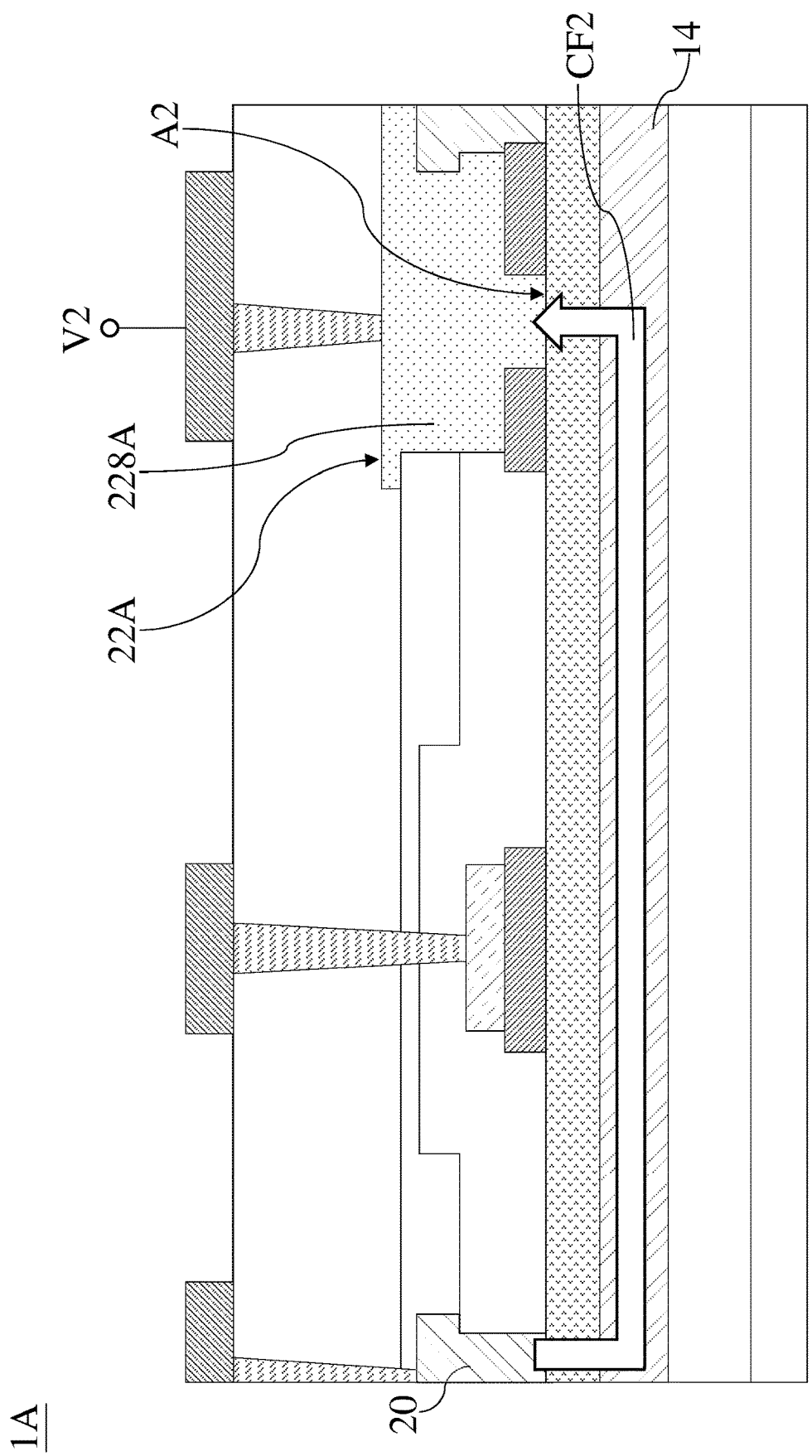

FIGS. 2A to 2C are schematic diagrams of a carrier flow in a semiconductor device 1A during an operation according to some embodiments of the present disclosure. During the operation in FIGS. 2A to 2C, a bias is applied to the gate electrode 32, so the semiconductor device 1A can be brought into a switch-on state (i.e., forward bias operation mode). Among FIGS. 2A to 2C, different magnitude of the forward bias is applied to the electrode structure 22A. Among FIGS. 2A to 2C, a drain voltage (Vd) applied to the electrode structure 22A is labeled as V1, V2, and V3, respectively, where V1<V2<V3. In the operation, the electrode 20 serves as a source electrode, and the electrode structure 22A serves as a drain structure.

Referring to FIG. 2A, a drain voltage V1 is applied to the electrode structure 22A. The drain voltage V1 is greater than zero and less than a turn-on voltage of the Schottky diode SD. A carrier flow CF1 (e.g., electron flow) can flow from the electrode 20 to the ohmic contact electrode 226A through the nitride-based semiconductor layer 14 (i.e., channel layer) and the contact interface A4 (i.e., the ohmic contact interface).

Referring to FIG. 2B, a drain voltage V2 is applied to the electrode structure 22A. The drain voltage V2 is greater than the turn-on voltage of the Schottky diode (see the Schottky diode SD of FIG. 1A) and is less than a turn-on voltage of the PN diodes (see the PN diodes PN1 and PN2 of FIG. 1A). A carrier flow CF2 can flow from the electrode 20 to the conductive layer 228A through the nitride-based semiconductor layer 14 and the metal-semiconductor junction A2 (i.e., the Schottky contact). The carrier flow CF2 can pass through the Schottky diode SD. In some embodiments, in addition to the carrier flow CF2, the carrier flow CF1 as mentioned in FIG. 2A may exist as well.

Referring to FIG. 2C, a drain voltage V3 is applied to the electrode structure 22A. The drain voltage V3 is greater than a turn-on voltage of each of the PN diodes (see the PN diodes PN1 and PN2 of FIG. 1A). A carrier flow CF3 can flow from the electrode 20 to the corresponding doped nitride-based semiconductor layer 222A or 224A through the nitride-based semiconductor layer 14 and the corresponded contact interface A1 or A3. The carrier flow CF3 can pass through the PN diode PN1 or PN2. In some embodiments, in addition to the carrier flow CF3, the carrier flow CF1 as mentioned in FIG. 2A or the carrier flow CF2 as mentioned in FIG. 2B may exist as well.

Therefore, in embodiments of the present disclosure, by the configuration of the electrode structure 22A (i.e., a JBS-ohmic structure), there are at least three operation modes for the switch-on state. The semiconductor device 1A can be optionally operated such that a carrier flow can flow from the electrode 20 to the electrode structure 22A at least through the ohmic contact or the Schottky contact so the overall on-resistance of the semiconductor device 1A can be reduced. Thus, the overall forward current of the semiconductor device 1A can be increased, and the power consumption of the semiconductor device 1A for the switch-on state can be reduced.

Referring back to FIG. 1A, the dielectric layer 50 can be disposed on/over/above the nitride-based semiconductor layer 16 and the gate structure 110. The dielectric layer 50 includes a plurality of through-holes TH. The dielectric layer 50 can be conformally disposed with the gate electrode 32 and the doped nitride-based semiconductor layer 30. The material of the dielectric layer 50 can include, for example but are not limited to, dielectric materials. For example, the dielectric layer 50 can include, for example but are not limited to, $SiN_x$, $SiO_x$, $Si_3N_4$, SiON, SiC, SiBN, SiCBN, oxides, nitrides, plasma enhanced oxide (PEOX), or combinations thereof. In some embodiments, the dielectric layer 50 can be a multi-layered structure, such as a composite dielectric layer of $Al_2O_3/SiN$, $Al_2O_3/SiO_2$, AlN/SiN, AlN/$SiO_2$, or combinations thereof.

The dielectric layer 52 can be disposed on/over/above the dielectric layer 50 and the electrode 20. The dielectric layer 52 can cover the electrode 20 and the dielectric layer 50. The exemplary material of the dielectric layer 50 can be identical with or similar with that of the dielectric layer 52.

The passivation layer 54 can be disposed on/over/above the dielectric layer 52, the electrode 20, and the drain structure 22A. The exemplary material of the passivation layer 54 can be identical with or similar with that of the dielectric layer 50. Moreover, the passivation layer 54 can serve as a planarization layer which has a level top surface to support other layers/elements. In some embodiments, the passivation layer 54 can be formed as a thicker layer, and a planarization process, such as chemical mechanical polish (CMP) process, is performed on the passivation layer 54 to remove the excess portions, thereby forming a level top surface.

The contact vias 60 can be disposed within the passivation layer 54 and the dielectric layers 50 and 52. The contact vias 60 can penetrate the passivation layer 54 and the dielectric layers 50 and 52, so as to extend longitudinally to connect to the corresponding electrode, such as the electrode 20, the electrode structure 22A, or the gate electrode 32. One of the contact vias 60 (the most right one in FIG. 1A) can penetrate the passivation layer 54 to make contact and electrically couple with the conductive layer 228A of the electrode structure 22A. The most right one of the contact vias 60 can be electrically coupled with doped nitride-based semiconductor layers 222A and 224A and the ohmic contact electrode 226A through the conductive layer 228A. The upper surfaces of the contact vias 60 are free from coverage of the passivation layer 54. The exemplary materials of the contact vias 60 can include, for example but are not limited to, conductive materials, such as metals or alloys.

The patterned conductive layer 64 can be disposed on/over/above the passivation layer 54 and the contact vias 60. The patterned conductive layer 64 is in contact with the contact vias 60. The patterned conductive layer 64 may have metal lines, pads, traces, or combinations thereof, such that the patterned conductive layer 64 can form at least one circuit. Hence, the patterned conductive layer 64 can serve as a patterned circuit layer. The patterned conductive layer 64 can connect with the electrode 20, the gate electrode 32, and the electrode structure 22A by the contact vias 60, respectively. An external electronic device can send at least one electronic signal to the semiconductor device 1A by the patterned conductive layer 64, and vice versa.

The exemplary materials of the patterned conductive layer 64 can include, for example but are not limited to, conductive materials. The patterned conductive layer 64 may include a single film or multilayered film having Ag, Al, Cu, Mo, Ni, Ti, alloys thereof, oxides thereof, nitrides thereof, or combinations thereof.

Different stages of a method for manufacturing the semiconductor device 1A are shown in FIG. 3A, FIG. 3B, FIG. 3C, FIG. 3D, FIG. 3E, and FIG. 3F, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 3A:
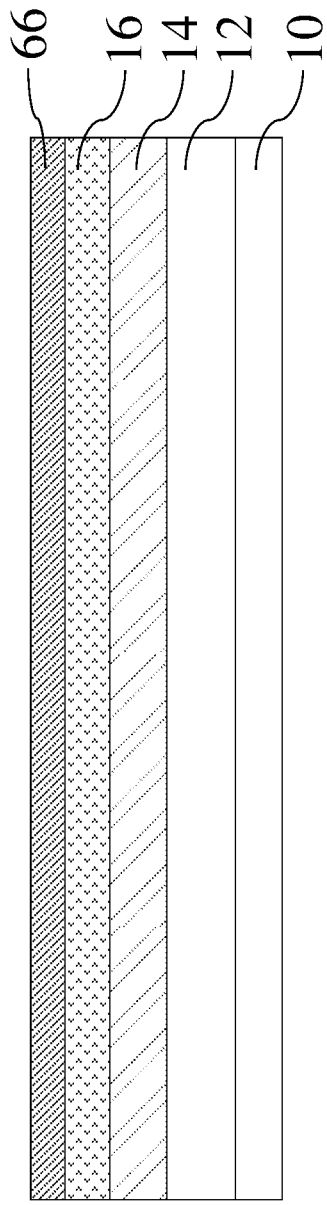

Referring to FIG. 3A, a substrate 10 is provided. A buffer layer 12 can be formed on/over/above the substrate 10 by using deposition techniques. Nitride-based semiconductor layers 14 and 16 can be formed on/over/above the substrate 10 in sequence by using deposition techniques. A blanket doped nitride-based semiconductor layer 66 can be formed on/over/above the nitride-based semiconductor layer 16 by using deposition techniques. In some embodiments, the deposition techniques can be performed for forming a blanket layer.

Figure 3B:
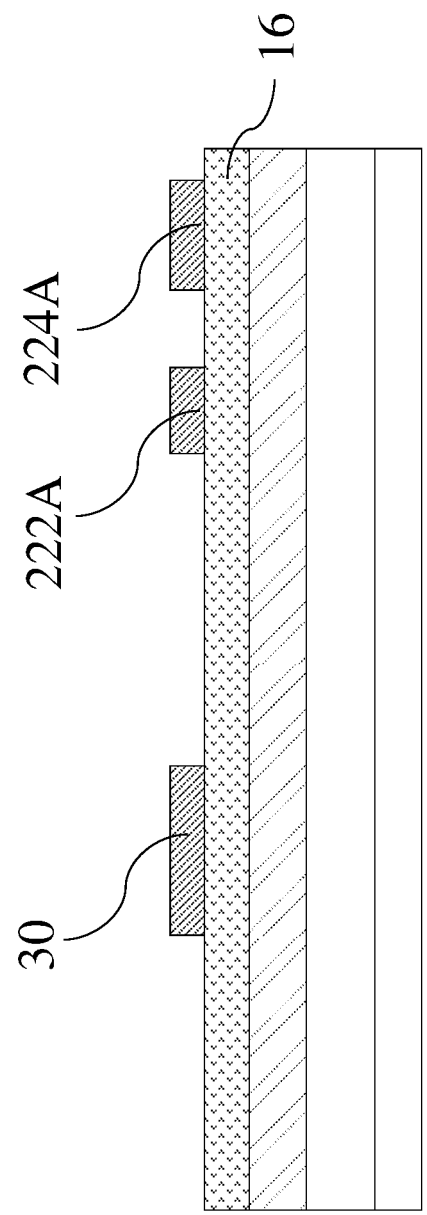

Referring to FIG. 3B, a patterning process is performed on the blanket doped nitride-based semiconductor layer 66 for removing excess portions thereof, thereby forming the three doped nitride-based semiconductor layers 30, 222A and 224A to be in contact with the nitride-based semiconductor layer 16. The three doped nitride-based semiconductor layers 30, 222A and 224A are formed to be physically separated from each other.

Referring to FIG. 3C, a gate electrode 32 can be formed on/over/above the doped nitride-based semiconductor layer 30. An intermediate dielectric layer 68 can be formed to cover the gate electrode 32, the doped nitride-based semiconductor layer 30, and the doped nitride-based semiconductor layers 222A and 224A. The formation of the gate electrode 32 and the intermediate dielectric layer 68 includes the deposition techniques and the patterning process.

Referring to FIG. 3D, an electrode 20 and an ohmic contact electrode 226A can be formed on/over/above and to be in contact with the nitride-based semiconductor layer 16. An intermediate dielectric layer 70 can be formed to cover the electrode 20, the ohmic contact electrode 226A, and the intermediate dielectric layer 68.

Referring to FIG. 3E, a patterning process is performed on the intermediate dielectric layers 68 and 70, so as to expose the doped nitride-based semiconductor layers 222A and 224A, and the ohmic contact electrode 226A, thereby forming the dielectric layers 50 and 52.

Referring to FIG. 3F, a conductive layer 228A is formed to be in contact with the nitride-based semiconductor layer 16, with the doped nitride-based semiconductor layers 222A and 224A, and with the ohmic contact electrode 226A. The conductive layer 228A is formed such that a region between the doped nitride-based semiconductor layers 222A and 224A is entirely filled with the conductive layer 228A. The conductive layer 228A is formed to directly cover the doped nitride-based semiconductor layers 222A and 224A and the ohmic contact electrode 226A. The formation of the conductive layer 228A includes the deposition techniques and the patterning process. Thereafter, a passivation layer 54, contact vias 60 and 62, and a patterned conductive layer 64 can be formed, obtaining the configuration of the semiconductor device 1A as shown in FIG. 1A and FIG. 1B.

Figure 4:
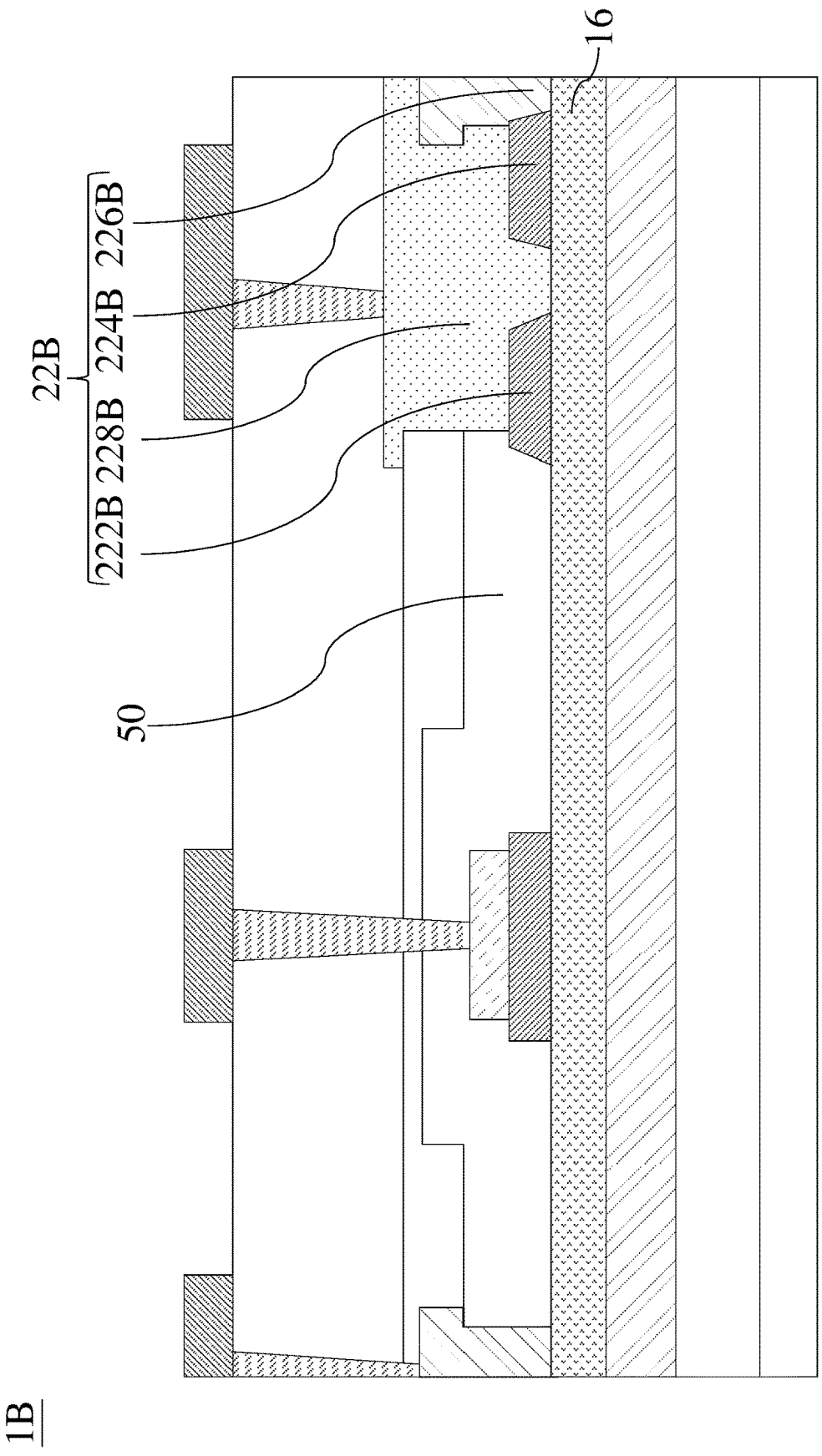
FIG. 4 is a vertical view of a semiconductor device according to some embodiments of the present disclosure.

FIG. 4 is a vertical view of a semiconductor device 1B according to some embodiments of the present disclosure. The semiconductor device 1B is similar to the semiconductor device 1A as described and illustrated with reference to FIG. 1A, except that the electrode structure 22A is replaced by an electrode structure 22B. The electrode structure 22B includes doped nitride-based semiconductor layers 222B and 224B, an ohmic contact electrode 226B, and a conductive layer 228B.

Each of the doped nitride-based semiconductor layer 222B and 224B can be formed to have at least one inclined sidewalls/surfaces. Each of the doped nitride-based semiconductor layers 222B and 224B abuts against the conductive layer 228B to form a slant interface. Each of the doped nitride-based semiconductor layer 222B and 224B can be formed to have two opposite inclined sidewalls/surfaces. The design of the inclined sidewalls/surfaces can define a taper carrier inlet from the nitride-based semiconductor layer 16 to the conductive layer 228B.

In this regard, once two doped nitride-based semiconductor layers are formed to be too close with each other, a carrier flow may not get entrance into a conductive layer between the doped nitride-based semiconductor layer. Once two doped nitride-based semiconductor layers are formed to be too far away from each other, the depletion provided by the doped nitride-based semiconductor layer with respect to a 2DEG region may be not insufficient.

In the present embodiment, even though the doped nitride-based semiconductor layer 222B and 224B are formed to be closer than the design, which may result from process variation, the taper carrier inlet can make a carrier flow tend to get entrance, being relatively easier than a straight carrier inlet. Thus, the reliability of the semiconductor device 1B can be increased.

Figure 5:
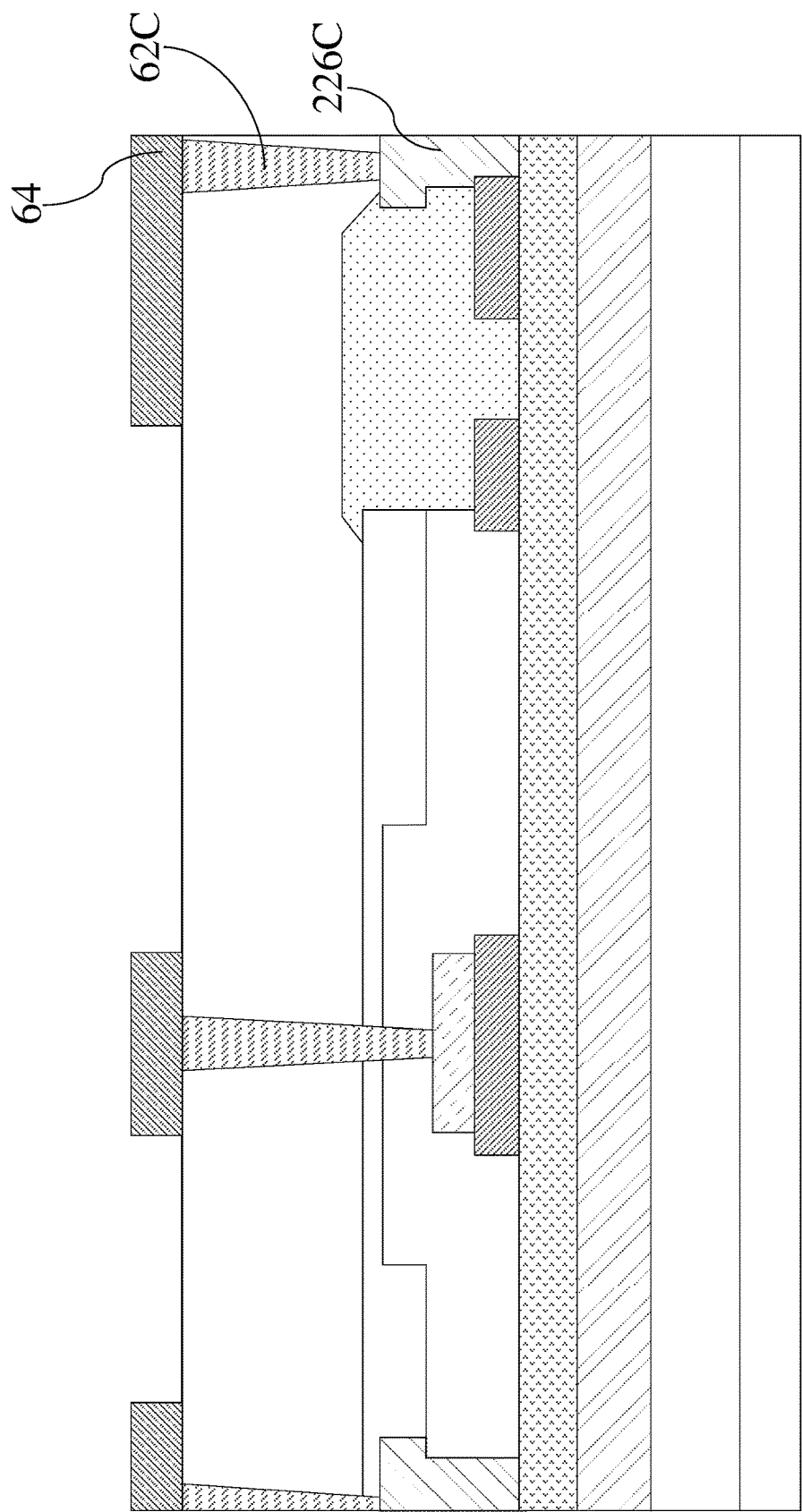
FIG. 5 is a vertical view of a semiconductor device according to some embodiments of the present disclosure.

FIG. 5 is a vertical view of a semiconductor device 1C according to some embodiments of the present disclosure. The semiconductor device 1C is similar to the semiconductor device 1A as described and illustrated with reference to FIG. 1A, except that a contact via 62C is positioned to connect an ohmic contact electrode 226C to the patterned conductive layer 64. Even though the contact via 62C is moved to make electrical connection to the JBS-ohmic structure at the ohmic contact electrode 226C, the JBS-ohmic structure can still work as afore-described. Therefore, the JBS-ohmic structure of the present disclosure is flexible and compatible with different HEMT designs.

FIG. 6 is a vertical view of a semiconductor device 1D according to some embodiments of the present disclosure. The semiconductor device 1D is similar to the semiconductor device 1A as described and illustrated with reference to FIG. 1A, except that the electrode structure 22A is replaced by an electrode structure 22D. The electrode structure 22D includes doped nitride-based semiconductor layers 222D and 224D, an ohmic contact electrode 226D, and a conductive layer 228D.

The ohmic contact electrode 226D can extend to a top surface of the conductive layer 228D. The ohmic contact electrode 226D can have a top surface in a position higher than the nitride-based semiconductor layers 222D and 224D and the conductive layer 228D. A contact via 62C connects the ohmic contact electrode 226C to the patterned conductive layer 64

In the manufacturing process of the semiconductor device 1D, the formation of the conductive layer 228D can be brought to a stage prior to the formation of the ohmic contact electrode 226D. Therefore, the process for manufacturing the semiconductor device 1D is flexible and is compatible with the process which has been applied, such that no need to create a new reticle for the formation of the ohmic contact electrode 226D.

Based on the above descriptions, in the present disclosure, a metal electrode, a conductive layer, and a doped nitride-based semiconductor layer are in contact with a barrier layer, such that an ohmic contact area, a Schottky diode and a PN diode can be formed along a direction. As such, depletion regions of the PN diode and the Schottky diode can be located between a gate electrode and the ohmic contact area, which is advantageous to improve the reverse withstand voltage of the device.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device comprising:
a first nitride-based semiconductor layer;
a second nitride-based semiconductor layer disposed on the first nitride-based semiconductor layer and having a bandgap greater than a bandgap of the first nitride-based semiconductor layer;
a source electrode and a gate electrode disposed over the second nitride-based semiconductor layer; and
a drain structure disposed over the second nitride-based semiconductor layer, the drain structure comprising:
a first doped nitride-based semiconductor layer in contact with the second nitride-based semiconductor layer to form a first contact interface;
an ohmic contact electrode in contact with the second nitride-based semiconductor layer to form a second contact interface; and
a conductive layer comprising metal and in contact with the second nitride-based semiconductor layer to form a metal-semiconductor junction therebetween, wherein the conductive layer is connected to the first doped nitride-based semiconductor layer and the ohmic contact electrode, and the second contact interface is farther away from the gate electrode than the first contact interface and the metal-semiconductor junction;
the drain structure further comprises:
a second doped nitride-based semiconductor layer in contact with the second nitride-based semiconductor layer to form a third contact interface between the gate electrode and the metal-semiconductor junction.

2. The nitride-based semiconductor device of claim 1, wherein the first contact interface is present between the metal-semiconductor junction and the second contact interface.

3. The nitride-based semiconductor device of claim 2, wherein the first contact interface abuts against the metal-semiconductor junction and the second contact interface.

4. The nitride-based semiconductor device of claim 1, wherein the conductive layer extends upward to a position higher than the first doped nitride-based semiconductor layer and the ohmic contact electrode.

5. The nitride-based semiconductor device of claim 4, wherein the conductive layer directly covers top surfaces of the first doped nitride-based semiconductor layer and the ohmic contact electrode.

6. The nitride-based semiconductor device of claim 5, further comprising:
a contact via connected to the conductive layer and electrically coupled with the first doped nitride-based semiconductor layer and the ohmic contact electrode through the conductive layer.

7. The nitride-based semiconductor device of claim 1, wherein the first doped nitride-based semiconductor layer abuts against the ohmic contact electrode to form a vertical interface.

8. The nitride-based semiconductor device of claim 1, wherein the metal-semiconductor junction abuts against the third contact interface.

9. The nitride-based semiconductor device of claim 1, wherein the conductive layer entirely fills a region between the first and second doped nitride-based semiconductor layers.

10. The nitride-based semiconductor device of claim 1, wherein the conductive layer directly covers top surfaces of the first and second doped nitride-based semiconductor layers.

11. The nitride-based semiconductor device of claim 1, wherein the first and second doped nitride-based semiconductor layers have different widths than each other.

12. The nitride-based semiconductor device of claim 1, wherein the conductive layer and the second nitride-based semiconductor layer collectively form a Schottky diode across the metal-semiconductor junction.

13. The nitride-based semiconductor device of claim 1, wherein the second contact interface is an ohmic contact interface.

14. The nitride-based semiconductor device of claim 1, wherein the conductive layer comprises titanium nitride.

15. A method for manufacturing a nitride-based semiconductor device, comprising:
forming a first nitride-based semiconductor layer on a substrate;
forming a second nitride-based semiconductor layer on the first nitride-based semiconductor layer;
forming a first doped nitride-based semiconductor layer in contact with the second nitride-based semiconductor layer;
forming an ohmic contact electrode in contact with the second nitride-based semiconductor layer and with the first doped nitride-based semiconductor layer;
forming a conductive layer in contact with the second nitride-based semiconductor layer, with the first doped nitride-based semiconductor layer, and with the ohmic contact electrode; and
forming a second doped nitride-based semiconductor layer in contact with the second nitride-based semiconductor layer and separated from the first doped nitride-based semiconductor layer.

16. The method of claim 15, wherein the conductive layer is formed such that a region between the first and second doped nitride-based semiconductor layers is entirely filled with the conductive layer.

17. The method of claim 15, wherein the conductive layer is formed to directly cover the first doped nitride-based semiconductor layer and the ohmic contact electrode.

18. The method of claim 15, wherein the conductive layer comprises titanium nitride.

* * * * *